(12) United States Patent
Lee et al.

(10) Patent No.: US 7,771,539 B2
(45) Date of Patent: Aug. 10, 2010

(54) HOLDER FOR FABRICATING ORGANIC LIGHT EMITTING DISPLAY

(75) Inventors: Kyu-Sung Lee, Kyunggi-do (KR); Kwan-Seop Song, Kyunggi-do (KR); Hee-Cheol Kang, Kyunggi-do (KR); Do-Geun Kim, Kyunggi-do (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 1064 days.

(21) Appl. No.: 11/483,773

(22) Filed: Jul. 11, 2006

(65) Prior Publication Data

US 2007/0023986 A1  Feb. 1, 2007

(30) Foreign Application Priority Data

Jul. 18, 2005  (KR) .................. 10-2005-0064968

(51) Int. Cl.
  *C23C 16/00* (2006.01)
  *C23F 1/00* (2006.01)
  *H01L 21/306* (2006.01)
(52) U.S. Cl. .................. 118/728; 156/345.51
(58) Field of Classification Search .......... 118/500, 118/715, 720, 721, 728, 729, 730, 731, 732; 156/345.1, 345.11, 345.19, 345.3, 345.51, 156/345.52, 345.53, 345.54, 345.55; 204/298.11; 216/12; 250/559.3; 355/53, 78; 356/375, 356/400, 401; 378/35; 414/792.2, 797.1; 427/468; 430/5

See application file for complete search history.

(56) References Cited

U.S. PATENT DOCUMENTS 6,331,095 B1 * 12/2001 Hiroki .................. 414/222.01

FOREIGN PATENT DOCUMENTS

| JP | 7-335725 | | 12/1995 |
| JP | 10152776 | | 6/1998 |
| JP | 11-036074 A | | 2/1999 |
| JP | 11036074 A | * | 2/1999 |
| JP | 2000-3952 | | 1/2000 |
| KR | 10-2003-0074376 | | 9/2003 |
| TW | 578183 | | 3/2004 |

OTHER PUBLICATIONS

English Machine Translation of JP 11036074 to Yoshioka et al. Obtained Oct. 21, 2009 from http://www19.ipdl.inpit.go.jp/PA1/cgi-bin/PA1INDEX.*
Chinese Office action corresponding to Chinese Patent Application No. 2006101062778, issued on Aug. 17, 2007.
The Notice of Allowance from the Taiwanese Patent Office issue in Applicant's corresponding Taiwanese Patent Application No. 95125058 dated Oct. 22, 2008.

* cited by examiner

*Primary Examiner*—Parviz Hassanzadeh
*Assistant Examiner*—Tiffany Nuckols
(74) *Attorney, Agent, or Firm*—Robert E. Bushnell, Esq.

(57) ABSTRACT

A holder for fabricating an organic light emitting display comprises: a holder main body; and a plurality of supporters provided on opposite sides of the holder main body; wherein each supporter has a ']'-shape and comprises a side wall having a predetermined height, and a supporting plate bent from the side wall. The supporting plate is formed with a plurality of stepped parts to support a substrate, a film tray and a mask, to hold the substrate, the film tray and the mask while the substrate, the film tray and the mask are being transported, and to prevent a pattern from being distorted, thereby transporting and processing a substrate, a film tray and a mask in a single chamber at the same time.

9 Claims, 3 Drawing Sheets

HOLDER FOR FABRICATING ORGANIC LIGHT EMITTING DISPLAY

CLAIM OF PRIORITY

This application makes reference to, incorporates the same herein, and claims all benefits accruing under 35 U.S.C. §119 from an application for HOLDER FOR FABRICATING ORGANIC LIGHT EMITTING DISPLAY, earlier filed in the Korean Intellectual Property Office on 18 Jul. 2005 and there duly assigned Ser. No. 10-2005-0064968.

BACKGROUND OF THE INVENTION

1. Technical Field

The present invention relates to a holder for fabricating an organic light emitting apparatus, and more particularly, to a holder for fabricating an organic light emitting display which is capable of transporting and processing a substrate, a film tray and a mask in a single chamber at the same time.

2. Related Art

As a general flat panel display device, an organic light emitting display device is a lightweight and thin display device that displays a color image using self-emission of an organic material. The organic light emitting display device has attracted attention as a new and useful display device because of its simple structure and high efficiency.

An organic light emitting device (OLED) includes an anode, a cathode, and organic films interposed between the anode and the cathode. The organic films at least include an emission layer. Furthermore, the organic films include, in addition to the emission layer, a hole injection layer, a hole transport layer, an electron transport layer, and an electron injection layer. The OLED is classified into a polymer organic light emitting device or a monomer organic light emitting device according to the organic films, particularly, according to materials of the emission layer.

In the OLED, the emission layer should be patterned in order to realize a full color display device. As a method of fabricating the OLED, there are a direct patterning method using a fine metal mask (FMM), a patterning method using laser induced thermal imaging (LITI), a patterning method using a color filter, etc.

When the LITI method realizing high resolution is used in fabricating the OLED, a film, such as a flexible polyethylene terephthalate (PET), polyethersulfone (PES), etc., and a film tray are needed to maintain the film in flat condition. Particularly, a large-sized film tray should be previously fabricated so as to realize a large-sized and high resolution OLED. In this case, not only should the film be flat, but also a tray for transporting the film into a vacuum chamber and for performing a deposition process should be lightweight.

Furthermore, in the LITI method, organic/inorganic layers should be formed on the film, and organic/inorganic/metal multi-thin layers should be formed on a glass substrate or a thin film transistor (TFT) substrate, so that a mask is required to form a pattern of each display device.

In the LITI method, a film-only chamber for forming the organic/inorganic layers on the film, and a substrate-only chamber for forming the organic/inorganic/metal layers on the substrate, are separately provided.

That is, the substrate is loaded into the substrate-only chamber, and the deposition process is performed to form the organic/inorganic/metal multi-thin layers on the substrate. Aside from this, the film is loaded into the film-only chamber and formed with the organic/inorganic layers thereon, and then an organic layer is transferred onto the substrate using a laser thermal transferring method.

As described above, the LITI method uses the film-only chamber and the substrate-only chamber independently of each other, so that its fabricating process is inconvenient. Furthermore, it is inconvenient because three different holders are needed to transport and support the substrate, the mask and the film tray, respectively.

SUMMARY OF THE INVENTION

Accordingly, it is an object of the present invention to provide a holder for fabricating an OLED and a flexible display using an LITI method, the holder being capable of transporting and processing a substrate, a film tray and a mask in a single chamber at the same time.

The foregoing and/or other objects of the present invention are achieved by providing a holder for fabricating an organic light emitting display, the holder comprising: a holder main body; and a plurality of supporters provided on opposite sides of the holder main body; wherein each supporter has a ']'-shape and comprises a side wall having a predetermined height, and a supporting plate bent from the side wall, the supporting plate being formed with a plurality of stepped parts to support a substrate, a film tray and a mask, to hold the substrate, the film tray and the mask while the substrate, the film tray and the mask are transported, and to prevent a pattern from being distorted.

According to an aspect of the invention, the supporting plate of the supporter comprises: a first supporting part formed with a first stepped part to support the substrate; and a second supporting part formed with a second stepped part to support the film tray and the mask at the same time.

According to another aspect of the invention, at least three supporters are provided on one side of the holder main body, and thus at least six supporters are provided on opposite sides of the holder main body.

According to a further aspect of the invention, the first supporting part of the supporting plate placed on both edges of one side of the holder main body is at least twice as long as the first supporting part of the supporting plate placed at the middle of one side of the holder main body. In this respect, the first supporting part of the supporting plate placed on both sides of one side of the holder main body is cut and opened to have a ']'-shape.

According to a still further aspect of the invention, the second supporting part comprises an extending part extended in a lengthwise direction so as to firmly support the film tray and the mask in the lengthwise direction. In this regard, the holder further comprises an auxiliary supporting part to support the film tray and the mask.

BRIEF DESCRIPTION OF THE DRAWINGS

A more complete appreciation of the invention and many of the attendant advantages thereof will be readily apparent as the same becomes better understood by reference to the following detailed description when considered in conjunction with the accompanying drawings in which like reference symbols indicate the same or similar components.

The above and/or other aspects and advantages of the invention will become apparent and more readily appreciated from the following description of the preferred embodiments, taken in conjunction with the accompanying drawings, of which.

DETAILED DESCRIPTION OF THE INVENTION

Exemplary embodiments of the present invention will now be described in detail with reference to the accompanying drawings. The following embodiments are described in order to enable those skilled in the art to obtain a thorough understanding of the invention. A variety of modifications can be made to the disclosed embodiments, and thus it should be noted that the present invention is not limited to the embodiment disclosed herein.

Figure 1:
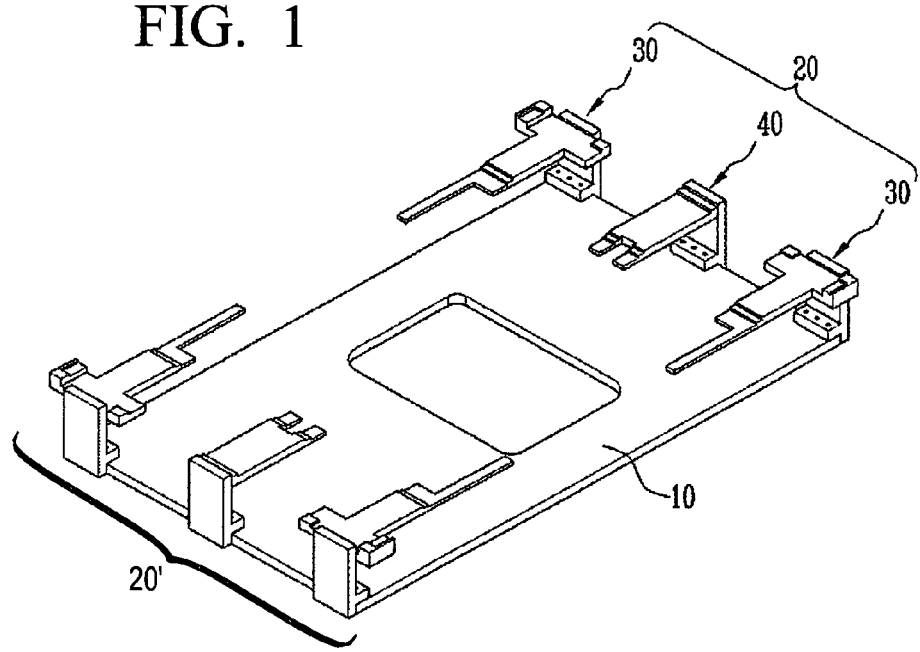
FIG. 1 is a perspective view of a holder according to a first embodiment of the present invention.
Figure 2:
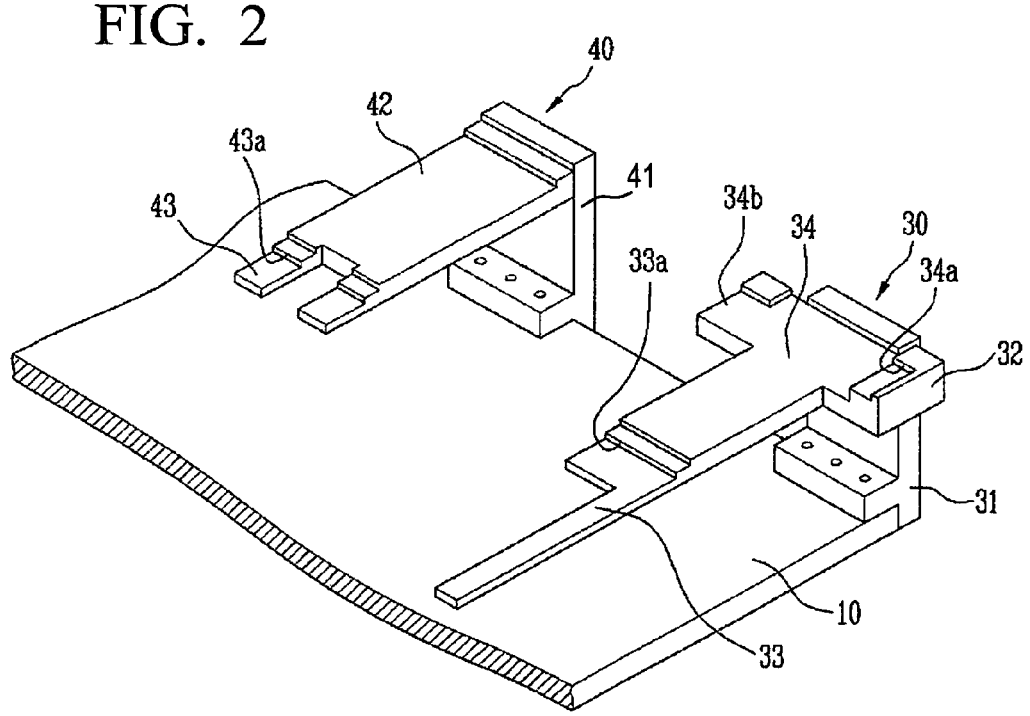
FIG. 2 is a partial enlarged perspective view of the holder of FIG. 1.

FIG. 1 is a perspective view of a holder according to a first embodiment of the present invention, and FIG. 2 is a partial enlarged perspective view of the holder of FIG. 1. As shown therein, the holder according to the first embodiment of the present invention includes a holder main body 10 having an approximately rectangular shape, and a plurality of supporters 20 provided on opposite sides of the holder main body 10.

In this embodiment, three supporters 20 are provided on one side of the holder main body 10, so that at least six supporters 20 and 20' are provided on respective sides of the holder main body 10. That is, the supporters 20 are provided on both sides and in the middle of one side of the holder main body 10, and are spaced apart from each other, leaving a predetermined distance therebetween. In this respect, the supporters 20 are provided in sufficient numbers to prevent the substrate from sagging; e.g., six or more supporters 20 and 20' are provided.

The supporters 20 provided on both edges of one side of the holder main body 10 include first supporters 30, and the supporter 20 provided in the middle of one side of the holder main body 10 comprises a second supporter 40. According to the first embodiment of the present invention, six supporters 20 and 20' are provided, but the invention is not limited thereto. Alternatively, the number of supporters 20 and 20' may be larger than six.

Thus, in the holder according to the first embodiment of the present invention, six supporters 20 and 20' are provided on respective opposite sides of the holder main body 10 so as to support a substrate, thereby smoothly transporting the substrate.

Each of the first and second supporters 30 and 40 includes a side wall 31 and 41, respectively, having a predetermined height, and a supporting plate 32 and 42, respectively, bent from the side wall 31 and 41, respectively, thereby having a ']'-shape. Therefore, the substrate or a film tray is put on the first and second supporters 30 and 40, respectively, leaving a predetermined distance from the holder main body 10.

The supporting plate 32 includes first and second stepped parts 33a and 34a, respectively, for supporting the substrate, the film tray and the mask, holding their positions while transporting them, and preventing a pattern from being distorted.

As shown in FIG. 2, the supporting plate 32 of the supporter 30 includes a first supporting part 33 formed with the first stepped part 33a to support the substrate, and a second supporting part 34 formed with the second stepped part 34a to support both the film tray and the mask.

In general, the film tray and the mask have the same structure, so that the second stepped part 34a according to the first embodiment of the present invention is formed to support both the film tray and the mask, but is not limited thereto. Alternatively, various shapes can be applied as necessary in order to support both the film tray and the mask.

The first supporting part 33 of the supporting plate 32 of the first supporter 30 is at least twice as long as the first supporting part 43 of the supporting plate 42 of the second supporter 40, thereby more firmly supporting the opposite edges of the substrate 50 (see FIG. 3) in a transverse direction when the substrate 50 is placed on the holder.

Thus, six supporters 20 and 20' are provided, and the first supporting part 33 of the first supporters 30 placed on opposite sides of the holder main body 10 is elongated, so that the holder prevents the large-sized substrate 50 from sagging. For example, the minimum sag of the substrate 50 is limited to 30 mm or less while the substrate 50 is supported.

Furthermore, the first supporting parts 33 of the supporting plates 32 of the first supporters 30 are cut and opened so as to have a ']'-shape and to support only the edges of the substrate 50.

Figure 3:
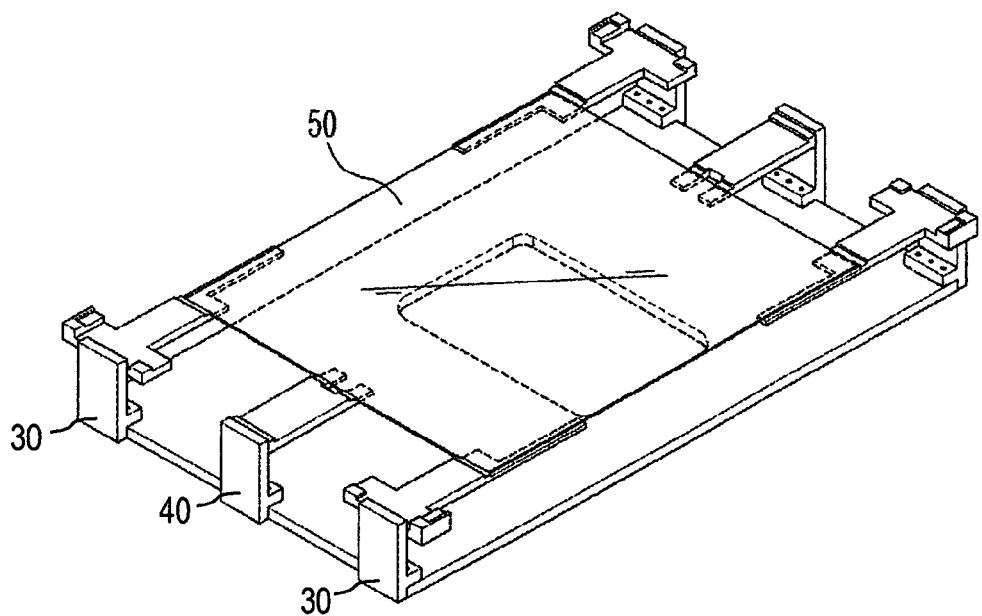
FIG. 3 is a perspective view illustrating that the holder of FIG. 1 supports a substrate.
Figure 4:
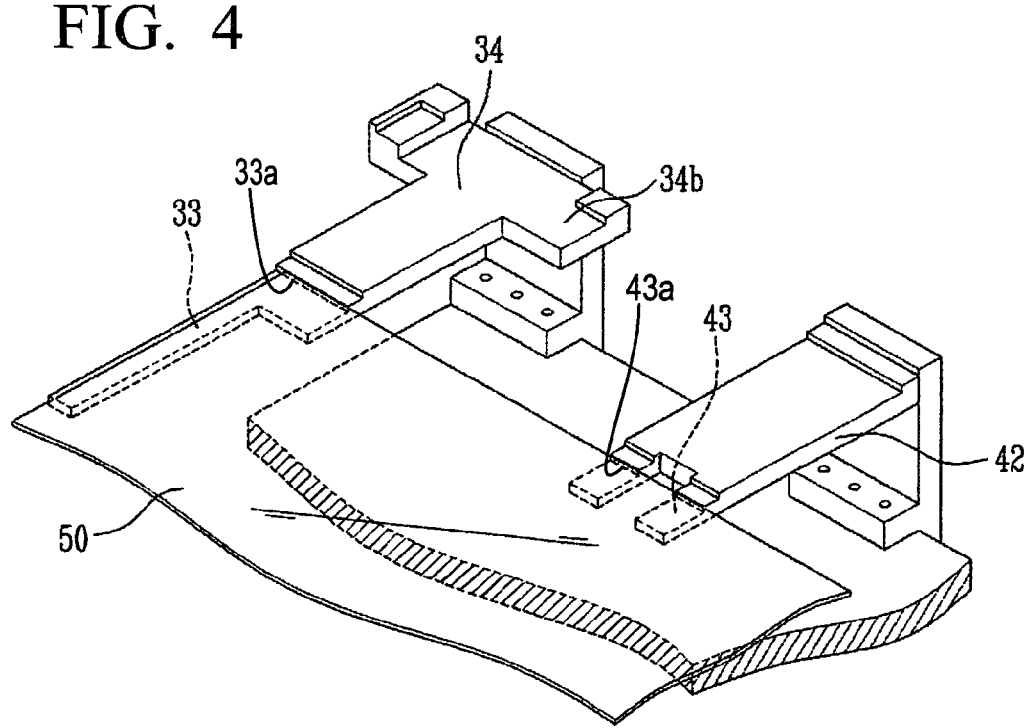
FIG. 4 is a partial enlarged perspective view of the holder of FIG. 3.

FIG. 3 is a perspective view illustrating that the holder of FIG. 1 supports a substrate, and FIG. 4 is a partial enlarged perspective view of the holder of FIG. 3. As shown therein, when a substrate 50 is placed on the first supporting parts 33 and 43, the substrate 50 is pre-aligned by the first stepped parts 33a and 43a, and is held in its own position while the substrate 50 is transported, thereby preventing a pattern from being distorted.

Meanwhile, the second supporting part 34 supports both the film tray and the mask. In particular, the second supporting part 34 of the first supporter 30 includes an extended part 34b extending in a lengthwise direction so as to firmly support the film tray and the mask in the lengthwise direction.

Figure 5:
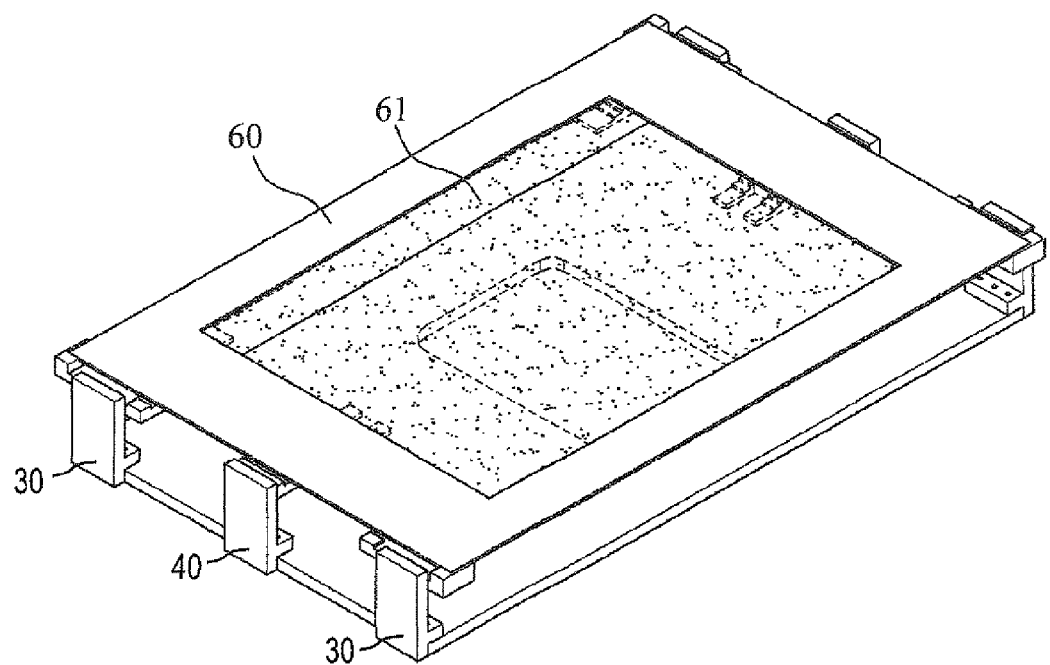
FIG. 5 is a perspective view illustrating that the holder of FIG. 1 supports a film tray.

FIG. 5 is a perspective view illustrating that the holder of FIG. 1 supports a film tray.

As shown in FIG. 5, the second supporting part 34 formed with the extended part 34b firmly supports the film tray 60 while the film tray 60 is put on the holder and transported. For example, the second supporting part 34 (FIGS. 2 and 4) of first supporters 30 can firmly support the mask and the film tray 60 having a weight of 15 kg or more to be transported.

Also, when the film tray 60 and the mask are put on the second supporting part 34, the film tray 60 and the mask are pre-aligned by the second stepped part 34a and are held in their own positions while the substrate 50 is transported, thereby preventing an OLED pattern from being distorted.

In this embodiment, the second supporting part 34 of the holder is formed with the stepped part 34a for pre-alignment, but the invention is not limited thereto. Alternatively, pre-alignment can be achieved by a pin structure.

The stepped parts 34a are formed so as to have a height which is sufficient to enable a film 61 to be held in the film tray 60 and to be supported by the first supporting parts 33 and 43 (FIG. 4) so as to be spaced apart from the substrate 50 by a distance of at least 2 mm.

Figure 6:
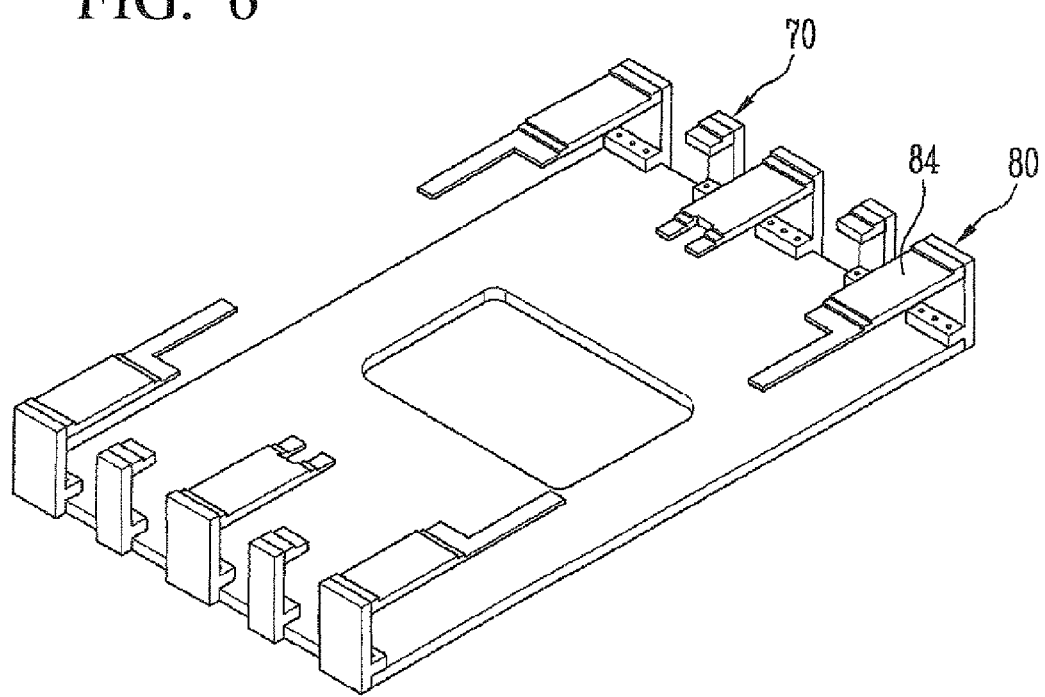
FIG. 6 is a perspective view of a holder according to a second embodiment of the present invention.

FIG. 6 is a perspective view of a holder according to a second embodiment of the present invention. As shown therein, a second supporting part 84 of a first supporter 80 is not extended in the lengthwise direction as in the first embodiment, and an auxiliary supporting part 70 is additionally provided to support the film tray and the mask.

According to the second embodiment of the present invention, the film tray is also firmly supported while being placed on the holder and transported, thereby achieving the same effect as in the first embodiment.

Furthermore, when a separate cassette structure is formed by stacking the holders in accordance with an embodiment of the present invention, two thru five levels of stack function, or more, can be performed. Additionally, in the case of a cluster method including many chambers, the holder may have a rotation function so as to be transferred among many clusters.

As described above, the present invention provides a holder for fabricating an OLED and a flexible display using an LITI method, the holder being capable of transporting and processing a substrate, a film tray and a mask in a single chamber at the same time.

Although preferred embodiments of the present invention have been shown and described, it will be appreciated by those skilled in the art that changes may be made in this embodiment without departing from the principles and spirit of the invention, the scope of which is defined in the claims and their equivalents.

What is claimed is:

1. A holder for fabricating an organic light emitting display, said holder comprising:
    a holder main body; and
    a plurality of supporters provided on opposite sides of the holder main body;
    wherein each supporter has a shape of an inverted "L" and comprises a substantially vertical side wall having a predetermined height, and a supporting plate bent and extending from the side wall, the supporting plate having a plurality of stepped parts for supporting a substrate, a film tray and a mask, for holding the substrate, the film tray and the mask while the substrate, the film tray and the mask are being transported, and for preventing a pattern from being distorted;
    wherein the supporting plate of said each supporter comprises a first supporting part having a first stepped part for supporting the substrate, and a second supporting part having a second stepped part for supporting the film tray and the mask at the same time; and
    wherein the first supporting part of each supporting plate placed on an edge of one side of the holder main body is at least twice as long as the first supporting part of each supporting plate placed in the middle of said one side of the holder main body.

2. The holder according to claim 1, wherein at least three supporters are provided on said one side of the holder main body, and at least three supporters are provided on an opposite side of the holder main body.

3. The holder according to claim 1, wherein the first supporting part of each supporting plate placed on said edge of said one side of the holder main body is cut and opened so as to have a shape of an "L".

4. The holder according to claim 1, further comprising an auxiliary supporting part for supporting the film tray and the mask.

5. A holder for fabricating an organic light emitting display, said holder comprising:
    a holder main body; and
    a plurality of supporters provided on opposite sides of the holder main body;
    wherein each supporter has a shape of an inverted "L" and comprises a substantially vertical side wall having a predetermined height, and a supporting plate bent and extending from the side wall, the supporting plate having a plurality of stepped parts for supporting a substrate, a film tray and a mask, for holding the substrate, the film tray and the mask while the substrate, the film tray and the mask are being transported, and for preventing a pattern from being distorted;
    wherein the supporting plate of said each supporter comprises a first supporting part having a first stepped part for supporting the substrate, and a second supporting part having a second stepped part for supporting the film tray and the mask at the same time;
    wherein at least three supporters are provided on one side of the holder main body, and at least three supporters are provided on an opposite side of the holder main body; and
    wherein the first supporting part of each supporting plate placed on an edge of said opposite side of the holder main body is at least twice as long as the first supporting part of each supporting plate placed in the middle of said opposite side of the holder main body.

6. The holder according to claim 3, wherein the first supporting part of each supporting plate placed on said edge of said opposite side of the holder main body is cut and opened so as to have a shape of an "L".

7. The holder according to claim 3, further comprising an auxiliary supporting part for supporting the film tray and the mask.

8. A holder according to claim 2, for fabricating an organic light emitting display, said holder comprising:
    a holder main body; and
    a plurality of supporters provided on opposite sides of the holder main body;
    wherein each supporter has a shape of an inverted "L" and comprises a substantially vertical side wall having a predetermined height, and a supporting plate bent and extending from the side wall, the supporting plate having a plurality of stepped parts for supporting a substrate, a film tray and a mask, for holding the substrate, the film tray and the mask while the substrate, the film tray and the mask are being transported, and for preventing a pattern from being distorted;
    wherein the supporting plate of said each supporter comprises a first supporting part having a first stepped part for supporting the substrate, and a second supporting part having a second stepped part for supporting the film tray and the mask at the same time; and
    wherein the second supporting part comprises an extended part extending in a lengthwise direction so as to firmly support the film tray and the mask in the lengthwise direction.

9. The holder according to claim 8, further comprising an auxiliary supporting part for supporting the film tray and the mask.

* * * * *